United States Patent [19]
Burns et al.

[11] 4,259,742
[45] Mar. 31, 1981

[54] ELECTRONIC SWITCHING SYSTEM FOR REDUCING NOISE TRANSIENTS

[76] Inventors: Richard C. Burns, 216 Stratford St., Syracuse, N.Y. 13210; Thomas N. Packard, 4871 McDonald Rd., Syracuse, N.Y. 13215

[21] Appl. No.: 957,713

[22] Filed: Nov. 6, 1978

[51] Int. Cl.³ .............................................. H04L 1/02
[52] U.S. Cl. ....................................... 455/52; 455/59; 455/101; 455/116; 455/134; 360/38; 179/1 P
[58] Field of Search ................ 325/56, 301, 304, 371, 325/474, 477, 397, 398, 400, 425, 59, 302, 303, 478, 65, 473, 475, 476, 370; 360/22, 38; 179/1 P; 307/233 R, 355, 362; 368/133, 154, 163, 165; 170/179 E; 455/52, 59, 101, 116, 134

[56] References Cited
U.S. PATENT DOCUMENTS

| | | | |
|---|---|---|---|
| 2,261,951 | 11/1941 | Bloch | 325/474 |
| 2,604,587 | 7/1952 | Lyons | 325/304 |
| 2,775,693 | 12/1956 | Berwin | 325/304 X |
| 2,968,718 | 1/1961 | McKesson | 325/56 |
| 3,401,340 | 9/1968 | Cronburg, Jr. et al. | 325/304 |
| 3,475,686 | 10/1969 | Holt, Jr. et al. | 325/304 |
| 3,588,705 | 6/1971 | Loch et al. | 325/482 X |
| 3,607,275 | 6/1971 | Kalliomaki et al. | 325/370 |
| 3,613,012 | 10/1971 | Feistel | 325/474 |
| 3,729,681 | 4/1973 | Elder | 325/302 X |
| 3,800,164 | 4/1974 | Miller | 328/147 X |
| 3,803,496 | 4/1974 | Groen | 325/477 X |
| 3,904,968 | 9/1975 | Brinegar | 325/477 X |
| 3,978,412 | 8/1976 | Frerking | 325/474 X |
| 3,989,897 | 11/1976 | Carver | 325/65 X |
| 3,997,844 | 12/1976 | Jayant | 325/56 |
| 4,030,040 | 6/1977 | Harbert | 325/302 X |
| 4,035,729 | 7/1977 | Perry | 325/478 X |
| 4,039,953 | 8/1977 | Chadwick | 325/304 |
| 4,155,041 | 5/1979 | Burns et al. | 325/65 X |

FOREIGN PATENT DOCUMENTS 603057  8/1960  Canada ..................................... 360/38

Primary Examiner—Robert S. Tupper
Assistant Examiner—Aristotelis M. Psitos
Attorney, Agent, or Firm—Squire, Sanders & Dempsey

[57] ABSTRACT

A system for reducing noise transients in electrical carrier signals, carried simultaneously over two separate channels, that are identical in their program component but differ in transient noise content, comprising means for comparing noise transients in the respective channels and for transmitting the electrical sum of the two channels unless the noise transients of the two channels differ by more than a selectable threshold amount, in which case only the carrier signal with the lesser noise transient is transmitted.

16 Claims, 4 Drawing Figures

ELECTRONIC SWITCHING SYSTEM FOR REDUCING NOISE TRANSIENTS

BACKGROUND OF THE INVENTION

1. Field of the Invention

The present invention relates to the transmission of electrical carrier signals, and to the recording and reproduction of sound, and in particular to the reproduction, the re-recording and the playback of previously recorded sound signals.

2. Description of the Prior Art

In playing back a sound recording, one hears not only a reproduction of the program component, but also the undesirable extraneous noise components that are caused by imperfections in the original recording and in the storage medium, damage to the storage medium, and inherent defects inadvertently introduced by the metal parts used in the manufacture of the storage medium. Such noises commonly are designated by such terms as "surface noise", "crackle", "ticks", etc. These noises are generally of a first type of an audibly continuous nature distributed fairly uniformly throughout the audio frequency range and known as "white" noise and of a second type which are transient sounds of short duration and high amplitude relative to the signal. (As used herein, the term "program component" refers to the electronic signal corresponding to the music, message or other sound intended to be transmitted to the listener or receiver; the term "noise transient" refers to the undesirable impulses and similar disturbances which may be imposed on the program material; and the terms "total input signal" or "carrier signal" refer to the total signal being transmitted—i.e., program component plus noise.)

Radio broadcast signals also may contain some additional noise components caused by disturbances in the transmission or reception, commonly called "static". Static, also, typically consists of pulses of short duration and high amplitude.

Previous processes in reducing unwanted noises in sound reproduction have relied on restricting the frequency range as far as is feasible for the purpose or application. Typically, the higher frequency components of the noise, usually referred to by such terms as "surface noise", "crackle", "ticks", etc. are suppressed by limiting the reproduction of the higher frequencies throughout the playback, usually at some sacrifice to the fidelity of reproduction of the signal. Some sophistication in this process was introduced by Harmon H. Scott whose Dynamic Noise Suppressor used electronic means automatically to alter the width of the frequency passband in record reproduction in accordance with the loudness of the music. The Scott Suppressor takes advantage of the phenomena that the relative sensitivity of the ear to various frequencies varies with the loudness of the sound, and that louder passages of music and other audio signals have a correspondingly improved masking effect on the surface noise perceived from the recording; so that, in louder passages a wider frequency range is feasible in reproduction than is the case in the reproduction of the quieter passages for similar listening comfort and perceived tone quality. The operation of the Dynamic Noise Suppressor is, basically, a rather gradual one, especially in closing down the frequency range after a loud sound, lest a too evident change in background noise becomes audible. The Dynamic Noise Suppressor, thus, is incapable of suppressing transient noises save in a generalized manner by its relatively long term modification of the pass band; it copes much more successfully with continuous "white" noise than with noises of a pronouncedly transient nature. These same observations apply to such recent developments and extensions of the Scott principle as are embodied in U.S. Pat. Nos. 3,678,416 (Burwen) and 3,803,357 (Sachs). A different method of subjectively reducing noise is described in U.S. Pat. No. 3,275,326 (Welch), in which two identical recordings playing simultaneously are auditioned.

Compressor-expander systems are well known in the art of sound recording and reproduction. These systems function by compressing the dynamic range in the recording process, and then by expanding the dynamic range in the playback process in an amount and manner complementary to the compression. The following U.S. patents disclose various compressor-expander systems: U.S. Pat. Nos. 3,655,355 (Dolby); 3,729,693 (Dolby); 3,732,371 (Burwen); 3,813,559 (De Boer); 3,815,039 (Fujisawa); 3,828,280 (Dolby); 3,829,715 (Van Sluys); and 3,846,719 (Dolby). These systems are only effective in reducing noise in those sound recordings which are specifically pre-encoded for such systems.

There are also noise reduction systems wherein noise transients are removed from transmitted signals by blanking operations wherein the entire signal is blocked from transmission for an interval intended to be coextensive with a noise transient, and the charge on a capacitor replaces the signal during the blanking interval. Thus, U.S. Pat. No. 3,668,416 (Burwen) described a circuit which utilizes a capacitor charged by low frequency energy from the input signal, and which substitutes the capacitor charge for the signal when a tick is detected. In U.S. Pat. No. 3,978,412 (Frerking), a switching device is described which "clamps" the audio signal for a predetermined blanking period when a noise transient is detected. A blank is instituted and a capacitor engages to load down and replace the signal emanating from the noise detector. Patent application Ser. No. 848,576, Nov. 4, 1977, by the present Applicants discloses a clipping process and system for reduction of noise transients.

Diversity receivers used in the reception broadcasts represent a specialized field of improvement of the program component of a carrier signal in which a choice is made of the best of two or more separate receptions of the same broadcast signal. The following U.S. patents disclose various diversity receiver systems: U.S. Pat. Nos. 2,969,718 (McKesson); 3,997,844 (Jayant); 2,604,587 (Lyons); 3,401,340 (Cronberg, Jr.); and 3,475,686 (Holt, Jr.).

A prior patent of the present applicants, U.S. Pat. No. 4,155,041, concerns the reduction of noise in a carrier signal that is caused by discrete noise transients. Novel methods for suppressing these are incorporated in the system. One method takes advantage of the circumstance that imperfections in a recording, such as imperfections in the record material, defects in manufacture, damge, dirt, wear, mildew, etc., which may introduce transient noises into the reproduction of the recording, are not identical on opposite sides of the record groove, whereas, in the case of a monophonic, lateral-cut phonograph record, the program component is identical on the opposite side walls of the groove. Our prior invention reduces transient noises in the reproduction of the recording by a continuous process of switching the reproduction to the one of the two groove walls having the lesser noise content. An additional embodiment of our prior invention provides means by which the switching process can be a three-way one between either of the groove side walls or the sum signal obtained by mixing the signals of the two side walls. It is this last described switching process that is the more effective one in reducing transient noises in the reproduction of lateral-cut monophonic records as, normally, in their reproduction with stereophonic playback equipment, the two channels of the reproduction are equally mixed, and this has the desirable result that effects caused by the vertical component of the stylus motion, such as pinch effect distortion and the vertical components of turntable rumble and surface noise and, also, noises due to vertical imperfections in some records, are cancelled out. In light of this cancellation of purely vertical noise, there are occasions when the combined or summed signal of the two channels has a lower net noise level than either of the component signals in the respective channels.

Other noise reduction and signal improvement systems are disclosed in U.S. Pat. Nos. 2,736,711 (Hanson); 2,912,571 (Jacobson); 3,171,901 (Clemency); 3,394,235 (Schott); 2,977,579 (Mullen); 3,800,164 (Miller); 2,261,951 (Bloch); 3,180,396 (Schroeder); 3,989,897 (Carver).

SUMMARY OF THE INVENTION

It is a general object of this invention to control the transmission of electrical signals according to the noise transients in the signals in a transmission system wherein a plurality of the signals are transmitted simultaneously and synchronously over separate channels, and the carrier signals have identical program components and differing noise transients.

It is another object of the present invention to eliminate or reduce noise transients from signals such as sound signals.

A further object of the invention is to provide apparatus for economically and effectively removing or reducing noise transients from sound signals. Yet another object is to provide improved apparatus for suppressing noise transients emanating from such sources as phonograph recordings and other signal carriers in which two or more channels can be made available that are identical in their program component but differ in noise content.

The present invention provides a system and process for controlling the transmission of electrical carrier signals according to their noise transients, wherein the carrier signals are transmitted synchronously and simultaneously over two or more separate channels. The signals include identical program components and differing noise transients, and the difference in the instantaneous magnitude between the signals of the respective channels is reflective of the difference in magnitude of their respective noise transients. The system includes summing means such as a mixer electrically connected to the channels for adding or mixing the electrical signals carried by the channels and for transmitting a mixed signal which is the electrical sum of the mixed signals; switching means connected to the channels and actuable for selectively disabling the summing means for enabling the transmission of the signal carried by a portion of the channels; and control means electrically connected to the channels for comparing the magnitudes of the electrical signals, and for actuating the switching means when the difference in the magnitudes of the compared signals exceeds a predetermined value.

In removing noise components from a monophonic disc or cylinder recording according to an embodiment of the invention, the original monophonic recording is played back with two-channel playback equipment. Apparatus according to a preferred embodiment of the invention includes means for detecting the channel in which the noise transient has the lesser amplitude at the point of occurrence of the noise transient, and for rapidly switching to choose the "quieter" channel for reproduction when the difference in the amplitude of the noise transient between the two channels exceeds a selectable threshold. Otherwise, the electrical sum of the two channels is chosen for reproduction. Although primarily conceived for playing back single recordings, the foregoing switching step is applicable also to all forms of retrieval of an identical program component from two or more separate signal sources that differ only in their noise content. Thus, it is applicable to two or more copies of the same recording played concurrently in synchronism either before or after reprocessing by the switching operation. It is also applicable to two or more different recordings of an identical radio broadcast, played concurrently in synchronism that differ in their noise content, or to a diversity receiver system for broadcast reception. It is applicable to the reception of more than two channels merely by the provision of additional units of the same kind, each of which can accommodate a pair of channels.

Further objects and features of the invention will be apparent from the following description and the appended claims.

DESCRIPTION OF THE PREFERRED EMBODIMENT

The present invention provides a process and apparatus for removing or reducing undesirable noise of a transient nature from signals such as sound signals emanating from such sources as sound recordings, radio broadcasts, and the like. In the system according to the preferred embodiment described below, there is a two-channel input wherein signals substantially identical in their program component are received simultaneously, and appropriate electronic circuitry compares the total input signals in the two channels and engages in a continuous process of selection of that channel having the lower instantaneous amplitude for transmission to the recording or reproducing apparatus, or else it transmits to the recording or reproducing apparatus a signal which is the electrical sum of the two total input signals.

Figure 1:
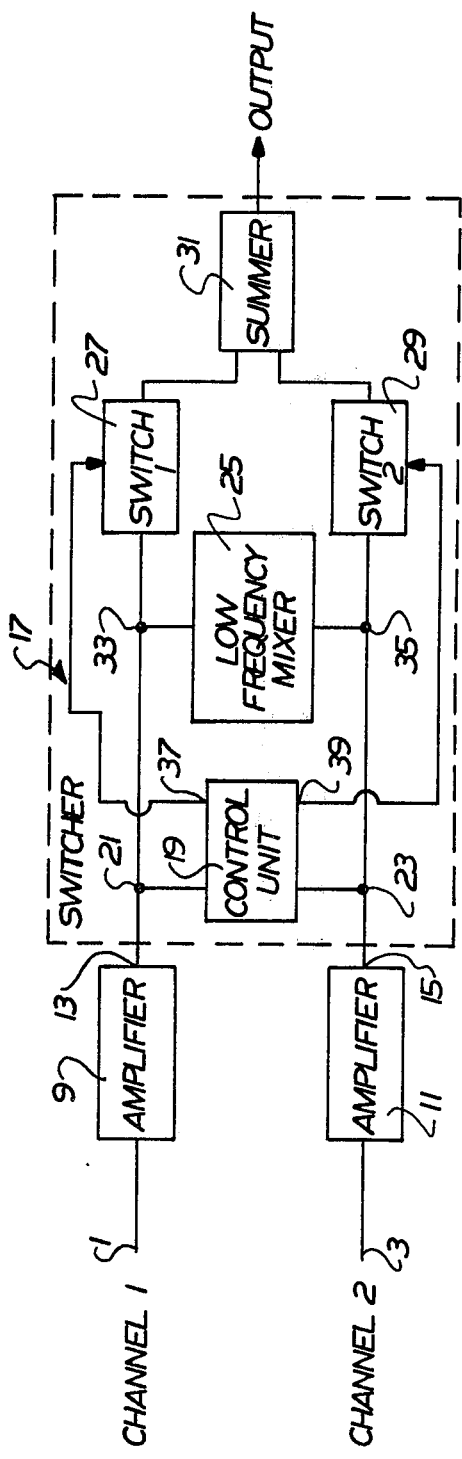
FIG. 1 is a diagram showing an embodiment of the invention.

Referring now to FIG. 1, there is illustrated a system which includes two input channels designated as Channel 1 and Channel 2. The input terminal of Channel 1 is designated by numeral 1 and the input terminal of Channel 2 is designated by the numeral 3. Channels 1 and 2 lead respectively to amplifiers 9 and 11. These amplifiers have output terminals 13 and 15, respectively, from which leads run to a switcher 17. Switcher 17 includes a control unit 19 connected at terminals 21 and 23 between the parallel lines from amplifier terminals 13 and 15. A low frequency mixer 25 is connected in parallel with control unit 19 between the parallel output lines of amplifiers 9 and 11, which output lines are connected respectively to a first switch 27 and a second switch 29. Switcher 17 further includes a summer, or mixer 31 connected to switches 27 and 29, and the output of summer device 31 is also the output of switcher 17. For the purposes of this description, Channels 1 and 2 are presumed to be the two channels of a stereophonic playback system, although these channels can be the output of any device that is transmitting two carrier signals that are identical in their program component. These two channels are connected to the carrier signal sources such that the instantaneous voltages of the program component in each are of the same polarity.

The signals on Channels 1 and 2 are applied to amplifiers 9 and 11. Means are provided, as explained hereinafter, for adjusting the gain of one of the two amplifiers so that their program component outputs are closely equal in magnitude and phase. The outputs of amplifiers 9 and 11 are applied to the input terminals 21 and 23 of control unit 19 and to low frequency mixer 25. This mixer mixes the low frequency components of the outputs of amplifiers 9 and 11 so that they are equal at terminals 33 and 35, to which mixer 25 is connected. Switches 27 and 29 are preferably fast acting switches operated by control unit 19, which applies a voltage through one or the other of its output terminals 37 and 39 to actuate only one of the two switches 27 and 29 at any time. Control unit 19 selects the actuation or non-actuation of the switches according to whether the instantaneous total input signal amplitude of one channel exceeds that of the other by more than a threshold amount. Control unit 19 only responds in the foregoing manner to high frequency signals, the lower frequency components being in effect not switched since the low frequency mixer 25 has rendered the low frequency components equal on each channel prior to the switching operation and prior to the input terminals 21 and 23 of the control unit.

Figure 2:
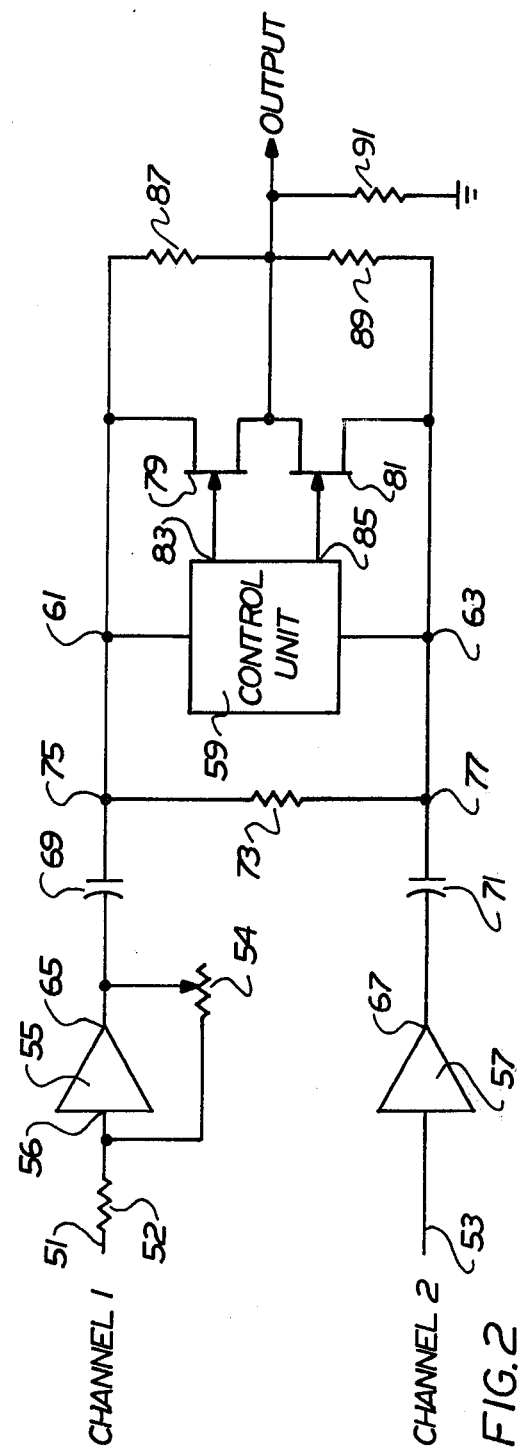
FIG. 2 is a diagram showing components which can be used in the switcher incorporated in the embodiment of FIG. 1.

FIG. 2 shows components which can be used in the switcher incorporated in the apparatus of FIG. 1. The circuitry of FIG. 2 includes input terminals 51 and 53 of Channels 1 and 2, respectively, which lead to amplifiers 55 and 57. Associated with amplifier 55 are the fixed resistor 52 and the adjustable resistor 54. These two resistors govern the amount of negative feedback applied to amplifier 55 and the gain of the amplifier is adjustable in accordance with the setting of variable resistor 54. The values of the two resistors can be chosen so that, when adjustable resistor is set at its center position, the gain of amplifier 55 equals that of amplifier 57, thus making it possible to adjust the gain of amplifier 55 over a considerable range of values both above and below the gain of amplifier 57, so that a considerable imbalance between the levels of the input signals of Channels 1 and 2 can readily be compensated for. Henceforth in this patent application, for the sake of simplicity in wording, we shall refer to equal signals being applied to Channels 1 and 2. However, it should be understood that carrier signals of unequal magnitude can be accommodated by virtue of the adjustable gain of amplifier 55.

It is possible to adjust the signal levels of the outputs of amplifiers 55 and 57 to equality with accuracy by inserting in series with either amplifier 55 or amplifier 57 a unity gain phase reversing amplifier and then either metering or auditing the output of the switcher with the switching action turned off. The gain of amplifier 55 is then adjusted for maximum cancellation of the program component. This method of listening also allows one to audition transient noise components independently of the program component. The phase reversing amplifier would be switched out of the circuit after the adjustment was concluded.

A control unit 59 is connected at junctures 61 and 63 to the lines leading from the output terminals 65 and 67 of amplifiers 55 and 57. The low frequency mixer corresponding to component 25 in FIG. 1 is comprised of capacitors 69 and 71 in the output lines of amplifiers 55 and 57, and a resistor 73 bridged across capacitors 69 and 71. This arrangement assures that the low frequency components of signals transmitted through the switcher will be identical at junctures 75 and 77 corresponding to junctures 33 and 35 in FIG. 1. The preceding arrangement is particularly suitable for an anticipated crossover frequency of approximately 300 Hz. A pair of fast acting, normally open switches 79 and 81, which can be high speed field effect transistors are connected across opposite ends of resistor 73, and operatively connected to output terminals 83 and 85 of control unit 59. Resistors 87 and 89 are respectively connected in parallel with switches 79 and 81, and a third resistor 91 is connected between the juncture of the latter resistors and the common signal return, or ground. Resistors 87-91 collectively comprise a summer corresponding to summer 31 in FIG. 1. Control unit 59 determines the operation of the switches by virtue of transmitting a signal from terminal 83 to close switch 79 or from terminal 85 to close switch 81 or by transmitting no signal from either terminals 83 or 85, thus allowing both switches 79 and 81 to remain open. These three modes of switch operation determine whether the signal only of Channel 1 or the signal only of Channel 2 or the sum of Channels 1 and 2 will be transmitted. The summing circuit, consisting of resistors 87-91, is devised so that the output signal level of the program component of the signal is the same whether the sum of Channels 1 and 2 is chosen or whether either Channel 1 or Channel 2 alone is chosen. Control unit 59 determines the operation of the switches such that the sum of the two channels is transmitted unless the difference in the instantaneous signal level of Channel 1 with respect to Channel 2 is greater than an adjustable threshold amount, in which case the signal having the lower instantaneous magnitude is transmitted. The lower frequency components of the input signal are effectively not switched since the low frequency mixer has brought to equality the low frequency components in the two channels prior to the switching operation.

Figure 3:
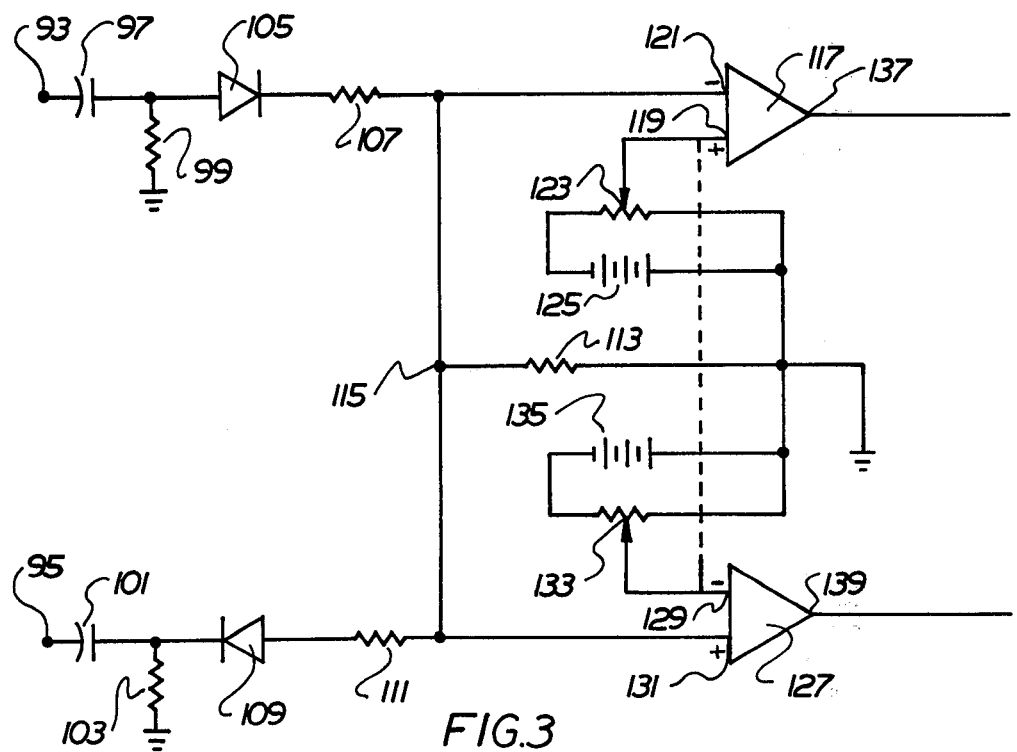
FIG. 3 shows a control unit suitable for incorporation in FIG. 1 or 2.

A control unit suitable for incorporation in the apparatus of FIGS. 1 and 2 is shown in FIG. 3. The input terminal that receives its signal from Channel 1 is designated by the numeral 93 and the input terminal that receives its signal from Channel 2 is designated by the numeral 95. As mentioned previously, input signals with their program components identical in magnitude and phase are received by each of the inputs 93 and 95. The signal path through the control unit includes a high pass filter in the form of an R-C circuit comprising a capacitor 97 and a resistor 99 for signals from Channel and the signals from Channel 2 are processed through the corresponding R-C circuit comprising capacitor 101 and resistor 103. These filters serve to eliminate from transmission into the control unit low frequency disturbances such as turntable rumble and hum and thumps which can occur in record playback, the latter of which is caused by record deformities such as warpage. These filters thereby protect the control unit from malfunctions which could be caused by these disturbances if they were not filtered out.

Following each of the high pass filters are full wave rectifier circuits represented by diode 105 and resistor 107 in Channel 1 and by diode 109 and resistor 111 in Channel 2, and a resistor 113 common to the two full wave rectifier circuits. Resistors 107 and 111 are connected at a juncture or adding means 115 in a line interconnecting the channels. The resistances of elements 107 and 111 are identical in value, but the polarities of rectifiers 105 and 109 are such that the full wave rectifier of line 93 produces a positive-going pulsating waveform at juncture 115 whereas the corresponding rectifier in line 95 produces a negative-going pulsating waveform at juncture 115.

The foregoing arrangement yields a voltage at juncture 115 which has a zero value when there are either equal or no noise components on Channels 1 and 2, a positive value when the noise level in Channel 1 exceeds that in Channel 2, or a negative value when the noise level in Channel 2 exceeds that in Channel 1. It will be recalled that the function of the switcher of which the control unit forms a part is to suppress noise transients, this being accomplished by transmitting both signals unless the signals in the two channels differ from each other in their amplitude (and hence their noise component) by more than a threshold amount, in which event the signal in the channel with the lower noise component is the only one transmitted. The polarity and magnitude of the voltage at juncture 115 at any time indicates the identity of the momentarily noisier of the two channels as well as the amount of their difference in noise.

The control unit of FIG. 3 further includes a comparator 117 having a negative or inverting input terminal 121 and a positive or non-inverting input terminal 119 connected to a variable resistor or potentiometer 123 across a voltage source 125. Likewise, the control unit includes a second comparator 127 having a negative or inverting input terminal 129, and a positive terminal 131 connected to a variable resistor or potentiometer 133 across a voltage source 135. The settings of variable resistors 123 and 133 can be synchronized so that the absolute magnitudes of the voltages at input terminals 119 and 129 are equal. When such an adjustment is effected, the instantaneous voltage at juncture 115 must exceed a positive threshold to change the output state of comparator 127 and must fall below a negative threshold of equal absolute magnitude to change the output state of comparator 117. This serves as a sensitivity control for the control unit, to prevent it from generating signals in response to insignificant voltage differences between channels 1 and 2, and to cause the switcher to operate in a symmetrical manner. Each comparator returns to its quiescent state as soon as the signal voltage falls below the absolute magnitude of the threshold adjustment. Thus, the switching on of Channel 1 or Channel 2 only lasts as long as the noise transient exceeds the threshold value, after which the condition of operation in which the sum of the two channels is chosen for transmission is restored.

Comparators 117 and 127 have output terminals 137 and 139, respectively, corresponding to control unit output terminals 83 and 85, FIG. 2. These are connected to switches 79 and 81, respectively, of FIG. 2.

When the instantaneous signal of Channel 1 exceeds that of Channel 2, a positive voltage will be present at juncture 115. If this positive voltage exceeds the threshold value established by the setting of potentiometer 133, comparator 127 will be triggered to its ON state and will deliver a signal from its output sufficient to close switch 81 (FIG. 2). This will cause the signal appearing at point 77 to be applied directly to the output of the switching unit, thus assuring that the signal of Channel 2 only is transmitted.

Similarly, when the instantaneous signal of Channel 2 exceeds that of Channel 1, a negative voltage will be present at juncture 115. If this negative voltage exceeds the threshold value established by the setting of potentiometer 123, comparator 117 will be triggered to its ON state and will deliver a signal from its output sufficient to close switch 79 (FIG. 2). This will cause the signal appearing at point 75 to be applied directly to the output of the switching unit, thus assuring that the signal of Channel 1 only is transmitted.

When the instantaneous signal level of neither channel exceeds that of the other channel by an amount sufficient to exceed the threshold values established by the settings of potentiometers 123 and 133, neither comparator will put out a switching command and, thus, both switches 87 and 89 will be in the open state. In such a case, the signal of Channel 1 is transmitted to the output through resistor 87 and the signal of Channel 2 is transmitted to the output through resistor 89. Resistor 91 serves as a voltage divider in conjunction with resistors 87 and 89 and the values of the three resistors are chosen so that the program component across resistor 91 is of the same amplitude regardless of whether it is received from both channels or from Channel or Channel 2 only.

Figure 4:
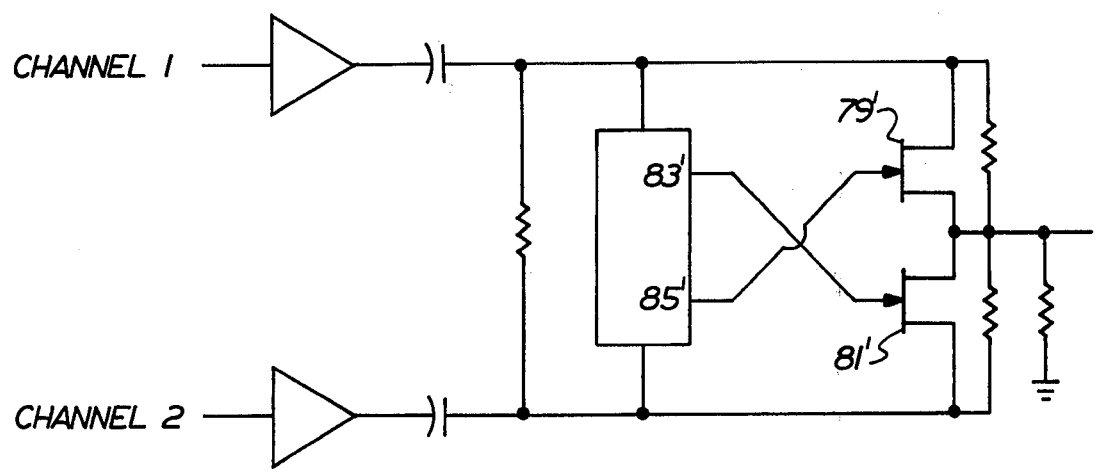
FIG. 4 shows another switcher suitable for incorporation in FIG. 1.

In some situations, where it is not necessary or desired to suppress "ticks" or other transient noise components, there may exist dropouts, fading or other sudden changes in the level of the carrier signal which it may be desired to alleviate. The latter object can be achieved with the circuit in FIG. 4, which is identical to the circuit of FIG. 2 with the exception that the outputs (83' and 85') of the control unit (59') are now reversed with respect to their connections to the switches (79' and 81'). Thus, the switches 79' and 81' that normally function to assure the transmission of signal from the channel that has the lesser instantaneous total instantaneous signal level will now function to secure transmission of the signal from the channel that has the greater instantaneous total input signal level. By replacing the permanent connections shown in FIGS. 2 and 4 between the control unit and the switches by a reversing switch, one can achieve, with one piece of equipment, the two modes of operation. Such a switch is also useful in demonstrating and testing the operation of the switcher by comparing the noise audible in the two different positions of the switch.

The invention described herein thus effectively reduces noise transients for sound signals in a manner which is not audibly discernable and does not impair the quality of the sound signal. The circuitry of the preferred embodiment is both practicable and economical and is effective in use.

The invention has been described in detail with particular emphasis on the preferred embodiment, but it will be understood that variations and modifications within the spirit of the invention may occur to those skilled in the art to which the invention pertains.

What we claim is:

1. A system for controlling the transmission of electrical carrier signals according to the noise transients in a plurality of electrical carrier signals transmitted synchronously and simultaneously over separate channels, the carrier signals each including a corresponding program component and noise transients and the difference in the instantaneous magnitude of the signals being reflective of the difference in magnitude of their respective noise transients, said system comprising
summing means operably connected to the channels for adding the electrical signals carried by said channels and for transmitting the added electrical signals;
switching means operably connected to the channels and actuable for disabling said summing means from transmitting said added electrical signals and for enabling the transmission of the electrical signal being transmitted in a portion of said channels and;
control means operably connected to the channels for comparing the instantaneous magnitudes of the electrical signals carried on the channels, and for actuating said switching means when the difference in magnitude of the respective noise transients of said signals exceeds a predetermined value.

2. The invention according to claim 1 wherein said separate channels are two in number, and said switching means comprise switches associated with each of said channels, said switches each having an open state, wherein the sum of the carrier signals in both channels is transmitted when the switches are both in the open state, and a closed state wherein a closed switch disables the summing means and enables the transmission of the carrier signal in the channel with which the switch is associated, said switches both being in the open state when the difference in magnitude of the noise transients of the electrical carrier signals in the channels at any time is below said predetermined level, and only the switch associated with the channel having the lesser noise transient level being in the closed state, when the difference in the magnitude of the noise transients in the respective signals at any time exceeds the predetermined level.

3. The invention according to either of claims 1 or 2 wherein said control means comprises threshold establishing means for establishing an electrical value definitive of said predetermined level.

4. The invention according to claim 2 wherein said channels have amplifier means for amplifying the respective input carrier signals, and gain control means electrically associated with one of said amplifiers for regulating the relative magnitudes of the input carrier signals.

5. The invention according to either of claims 1 or 2 and further including low frequency mixing means for equalizing the low frequency components of the electrical carrier signals in the respective channels, to render said control means responsive only to the portion of the respective carrier signals having frequencies above the low frequencies mixed by said low frequency mixing means.

6. The invention according to either of claims 1 or 2 wherein said control means comprises
adding means for adding the carrier signals in the respective channels together to yield a combined signal reflective of the difference in magnitude between the respective carrier signals;
threshold establishing means for establishing predetermined voltage values;
comparing means connected to said adding means and to said threshold establishing means, and to said switching means, said comparing means comparing the combined signal at said adding means with said predetermined voltage values, and for generating output signals to actuate said switching means when said combined signal exceeds the predetermined voltage value with which the combined signal is compared.

7. The invention according to claim 2 and further including rectifying means associated with said first and second channels for rectifying the carrier signals in the respective channels to generate signals of opposite polarity in said channels; and adding means interconnecting said channels for adding the respective carrier signals to yield a combined signal with a value reflective of the difference in magnitude between the respective carrier signals; said switches being responsive to the magnitude of said combined signal.

8. The invention according to claim 1 wherein said switching means are actuable for enabling the transmission of the electrical signals being transmitted in that portion of said channels having the lowest noise transient level.

9. The invention according to claim 1 wherein said switching means are actuable for enabling the transmission of the electrical signals being transmitted in that portion of said channels having the greatest magnitude.

10. A system for controlling the transmission of electrical carrier signals transmitted synchronously and simultaneously over first and second channels, the carrier signals each including an identical program component and differing noise transients, and the difference in the instantaneous magnitudes of the carrier signals being reflective of the difference in their noise transients, said system comprising:
first and second rectifying means connected in said first and second channels, respectively, for rectifying the carrier signals in the respective channels to generate a positive carrier signal in the first channel and a negative carrier signal in the second channel;
adding means interconnecting said channels for adding the respective carrier signals to yield a combined signal with a value reflective of the difference in magnitude between the respective carrier signals;
first and second voltage establishing means associated with the first and second channels for establishing first and second threshold voltages of opposite polarity, said voltage establishing means being connected to said adding means to generate a trigger signal when said combined signal exceeds either of said threshold voltages;
first and second comparators having negative and positive input ports respectively connected to the first and second channels, and positive and negative input ports connected to the respective first and second threshold means, one of said comparators generating a switching signal in response to the transmission of one of said trigger signals to said one comparator;

a summer comprising resistance devices connected to said first and second channels and to each other; and first and second switches connected to said first and second comparators and being in low resistance lines shunting said respective resistance devices; said switches being normally open but closing in response to the generation of a switching signal by the comparator connected thereto;

said summer adding the carrier signals in the first and second channels to yield as an output the electrical sum of said carrier signals when the difference in the noise transient levels in the carrier signals is below said threshold values, and the one of said first and second switches receiving a switching signal from its associated comparator closing to yield as an output the carrier signal having the lower noise transient level when the difference in noise transient levels in the carrier signals exceeds the threshold values.

11. The invention according to claim 9 wherein the resistance devices of said summer meet at a first juncture and said switches are connected together at a second juncture, and wherein said system further includes output resistance means connected to said first and second juncture.

12. The invention according to claim 10 wherein the resistances of the resistance devices of said summer and of said output resistance means cause said devices and said output resistance means to yield an output signal with the same program component for input carrier signals having equal program components, when either or both of said switches are open.

13. The invention according to claim 2 and further including balance adjustment means for adjusting the program component of the two channels to equalize the program components of the respective carrier signals.

14. The invention according to claim 2, and further including balance adjustment means for equalizing the program components of the respective carrier signals in said first and second channels, said balance adjustment means comprising a unity-gain phase reversing amplifier connected in series in one of said channels.

15. The invention according to claim 9, and further including balance adjustment means for adjusting the program component of the two channels to equalize the program components of the respective carrier signals.

16. The invention according to claim 9, and further including balance adjustment means for equalizing the program components of the respective carrier signals in said first and second channels, said balance adjustment means comprising a unity-gain phase reversing amplifier connected in series in one of said channels.

* * * * *